United States Patent
Levhar et al.

(10) Patent No.: US 9,360,879 B2
(45) Date of Patent: Jun. 7, 2016

(54) SENSE CURRENT GENERATION APPARATUS AND METHOD

(71) Applicant: Microsemi Corp.—Analog Mixed Signal Group Ltd., Hod Hasharon (IL)

(72) Inventors: Gabi Levhar, Ruhama (IL); Shimon Cohen, Burgata (IL)

(73) Assignee: Microsemi Corp.-Analog Mixed Signal Group, Ltd., Hod Hasharon (IL)

( * ) Notice: Subject to any disclaimer, the term of this patent is extended or adjusted under 35 U.S.C. 154(b) by 0 days.

(21) Appl. No.: 14/676,851

(22) Filed: Apr. 2, 2015

(65) Prior Publication Data

US 2015/0309524 A1   Oct. 29, 2015

Related U.S. Application Data

(60) Provisional application No. 61/984,924, filed on Apr. 28, 2014.

(51) Int. Cl.
  *G05F 3/02* (2006.01)
  *G01R 31/00* (2006.01)

(52) U.S. Cl.
  CPC . *G05F 3/02* (2013.01); *G01R 31/00* (2013.01)

(58) Field of Classification Search
  CPC ........................................ G05F 1/561
  USPC ................................................ 327/103
  See application file for complete search history.

(56) References Cited

U.S. PATENT DOCUMENTS

| | | | | |
|---|---|---|---|---|
| 5,815,027 A * | 9/1998 | Tihanyi | ................ | G01R 1/203 327/538 |
| 5,986,441 A * | 11/1999 | Koroncai | ......... | G01R 19/16519 323/277 |
| 6,323,703 B1 * | 11/2001 | Fotouhi | ............ | H03K 19/00315 327/112 |
| 6,414,404 B1 * | 7/2002 | Allen | ................ | H03K 17/0822 307/130 |
| 6,552,889 B1 * | 4/2003 | Huang | ............... | H03K 17/0822 361/93.1 |
| 6,661,249 B2 * | 12/2003 | Oyrer | ...................... | G05F 3/262 324/762.09 |
| 6,847,091 B2 | 1/2005 | Deboy et al. | | |
| 7,202,711 B2 * | 4/2007 | Gose | .................. | G01R 19/0092 323/316 |
| 7,372,685 B2 * | 5/2008 | Beck | .................. | H03K 17/0822 327/434 |
| 7,557,557 B2 * | 7/2009 | Sugie | ...................... | G11B 19/28 323/277 |
| 8,242,747 B2 * | 8/2012 | Arai | ...................... | H02J 7/0072 307/31 |
| 8,373,449 B2 | 2/2013 | Thiele et al. | | |
| 8,610,415 B2 * | 12/2013 | Maher | ................... | G05F 1/5735 323/274 |
| 2009/0096531 A1 * | 4/2009 | Shimamoto | .......... | H03K 1/0216 330/297 |
| 2012/0187930 A1 * | 7/2012 | Williams | .............. | G05F 1/5735 323/273 |
| 2013/0293986 A1 * | 11/2013 | Lerner | ..................... | G05F 1/573 361/18 |
| 2014/0340060 A1 * | 11/2014 | Capofreddi | ............. | G05F 1/565 323/280 |
| 2015/0249464 A1 * | 9/2015 | Cohen | ..................... | H03M 1/18 341/155 |

* cited by examiner

*Primary Examiner* — Thomas J Hiltunen
(74) *Attorney, Agent, or Firm* — Simon Kahn

(57) ABSTRACT

A sense current generation apparatus constituted of: a main electronically controlled switch arranged to provide a current path for an input current; a sense electronically controlled switch arranged to generate a sense current; a voltage matching circuit arranged to adjust the voltage across the first and second terminals of the sense switch to equal the voltage across the first and second terminals of the main switch, within a predetermined maximum error voltage, such that the sense current is representative of the input current; and a voltage governor arranged to: receive an indication of the voltage across the first and second terminals of the main switch; and responsive to the received voltage indication, adjust the control voltage of the main switch such that the absolute value of the voltage across the terminals thereof is maintained above a predetermined voltage threshold greater than a boundary of the error range.

10 Claims, 7 Drawing Sheets

SENSE CURRENT GENERATION APPARATUS AND METHOD

TECHNICAL FIELD

The invention relates generally to the field of current sensing of electronically controlled switch load currents and particularly to an apparatus and method of current sensing of an electronically controlled switch load current in cooperation with a sense electronically controlled switch.

BACKGROUND

Current sensing circuits using so-called current sensing transistors (or "sense FETs") have been commonly used for years. Such current sensing techniques may be especially useful when measuring the load current of power field effect transistors (power FETs) which are composed of a plurality of transistor cells as illustrated, for example, in U.S. Pat. No. 6,847,091, granted Jan. 25, 2005 to Deboy et al., the entire contents of which is incorporated herein by reference. Such power field effect transistors have a common drain region for all transistors cells composing the power transistor component. The common drain region is connected by one drain electrode arranged on the back-side of a wafer, whereas the source region and the respective source electrodes are contacted on the front-side of the wafer and connected in parallel. The source electrode of one transistor cell (referred to as "sense cell") may be separately connected to tap a current signal that is representative of the load current flowing through the plurality of transistor cells of the load transistor. In a circuit arrangement including a load transistor/sense transistor pair, the source current of the sense transistor is directly proportional to the source current of the load transistor whereby the factor of proportionality results from the ratio of the current conducting area of the load transistor and the current conducting area of the sense transistor.

The proportionality condition mentioned above is only met when both transistors (load transistor and sense transistor) operate in the same operating point, i.e., when both transistors are supplied with the same gate-source voltage and are exposed to the same drain-source voltage. U.S. Pat. No. 8,373,449, granted on Feb. 12, 2013 to Thiele et al., the entire contents of which are incorporated herein by reference, is addressed to a current sensing circuit arrangement where a load transistor and a sense transistor have a common source electrode and a common gate voltage. A closed loop operational amplifier circuit is arranged to equalize the drain voltages of the load transistor and the sense transistor.

FIG. 1 illustrates a high level schematic diagram of a current sensing circuit arrangement 10 according to the prior art. Arrangement 10 comprises: a main electronically controlled switch 20, hereinafter termed "main switch 20" for brevity; a sense electronically controlled switch 30, hereinafter termed "sense switch 30" for brevity; a voltage matching circuit 35, comprising an amplifier 40, implemented without limitation as an operational amplifier (op-amp), and an electronically controlled switch 50, hereinafter termed "switch 50" for brevity; a current mirror 60, comprising an input electronically controlled switch 70, herein after termed "input switch 70" for brevity, and an output electronically controlled switch 80, herein after termed "output switch 80" for brevity; and a sense impedance element, illustrated as a sense resistor RS. Each of main switch 20, sense switch 30 and switch 50 are illustrated as an n-channel metal-oxide-semiconductor field-effect-transistor (NMOSFET), however this is not meant to be limiting in any way. Each of input switch 70 and output switch 80 are illustrated as a p-channel metal-oxide-semiconductor field-effect-transistor (PMOSFET), however this is not meant to be limiting in any way.

The gates of main switch 20 and sense switch 30 are coupled to a common gate voltage, denoted VG, and the sources of main switch 20 and sense switch 30 are coupled to a common potential. The drain of main switch 20 is coupled to the non-inverting input of op-amp 40 and the inverting input of op-amp 40 is coupled to the drain of sense switch 30 and the source of switch 50. The output of op-amp 40 is coupled to the gate of switch 50. The drain of switch 50 is coupled to the drain of input switch 70 and to the gates of input switch 70 and output switch 80. The sources of input switch 70 and output switch 80 are coupled to a supply voltage, denoted VMAIN. The drain of output switch 80 is coupled to a first end of sense resistor RS and a second end of sense resistor RS is coupled to the common potential. A first end of a load 90 is coupled to the drain of main switch 20 and a second end of load 90 is coupled to supply voltage VMAIN.

In operation, main switch 20 is at least partially closed by common gate voltage VG to provide a current path for a load current, denoted ILOAD, generated responsive to load 90, the drain-source voltage of main switch 20 responsive to the magnitude of load current ILOAD and voltage drop across load 90. The operation of op-amp 40 and switch 50 of voltage matching circuit 35 causes the potential at the drain of sense switch 30 to be equal to the potential at the drain of main switch 20. As a result of the equality of the potential at the drain of sense switch 30 with the potential at the drain of main switch 20, the equality of the potential at the source of sense switch 30 with the potential at the source of main switch 20, and the equality of the potential at the gate of sense switch 30 with the potential at the gate of main switch 20, a sense current, denoted IS, is generated within sense switch 30, the magnitude of sense current IS being directly proportional to the magnitude of current ILOAD. The ratio of the magnitudes of sense current IS and load current ILOAD is equal to the ratio of the areas of main switch 20 and sense switch 30. Sense current IS is received by input switch 70 of current mirror 60 and a mirrored current, denoted ISENSE, is generated by output switch 80. The magnitude of current ISENSE is directly proportional to the magnitude of sense current IS, the ratio of the magnitudes being equal to the ratio of the area of output switch 80 and the area of input switch 70. The magnitude of current ISENSE is thus directly proportional to the magnitude of current ILOAD, i.e.:

$$ISENSE = ILOAD * K \qquad \text{EQ. 1}$$

where K equals the area ratio of main switch 20 and sense switch 30 times the area ratio of input switch 70 and output switch 80. A voltage is developed across sense resistor RS responsive to current ISENSE flowing therethrough. The developed voltage can be used for measuring load current ILOAD responsive to EQ. 1.

Unfortunately, op-amp 40 exhibits an input offset voltage error, typically on the order of several tens of millivolts. The equalization of the potentials at the drains of main switch 20 and sense switch 30, and as a result the equalization of the drain-source voltages of main switch 20 and sense switch 30 is thus only accurate to within a predetermined error range. Therefore, there is a difference between the magnitude of current ISENSE and the magnitude of current ILOAD times constant K, the error denoted E. In the event that the magnitude of ILOAD is very small and the on-resistance of main switch 20 is very small, the drain-source voltage of main switch 20 will also be very small and the offset voltage error of op-amp 40 may be significant in relation to the drain-source voltage of main switch 20, i.e. the error in the equalization of the drain-source voltages of main switch 20 and sense switch 30 will be a significant percentage of the drain-source voltage of main switch 20. Therefore, error E will be a significant percentage of current ILOAD, rendering current ISENSE useless for providing an accurate measurement of load current ILOAD.

SUMMARY OF THE INVENTION

Accordingly, it is a principal object of the present invention to overcome the disadvantages of prior art sense current generation techniques. This is accomplished in one embodiment by a sense current generation apparatus comprising: a main electronically controlled switch comprising a first terminal and a second terminal, the main electronically controlled switch arranged to provide a current path for an input current; a sense electronically controlled switch comprising a first terminal and a second terminal, the sense electronically controlled switch arranged to generate a sense current therethrough; a voltage matching circuit in communication with the first terminal of the main electronically controlled switch and the first terminal of the sense electronically controlled switch, the voltage matching circuit arranged to adjust the voltage across the first and second terminals of the sense electronically controlled switch to equal the voltage across the first and second terminals of the main electronically controlled switch, within a predetermined maximum error voltage, such that the generated sense current is representative of the input current; and a voltage governor arranged to: receive an indication of the value of the voltage across the first and second terminals of the main electronically controlled switch; and responsive to the received voltage value indication, adjust the gate voltage of the main electronically controlled switch such that the absolute value of the voltage between the first terminal and the second terminal of the main electronically controlled switch is maintained above a predetermined voltage threshold, the predetermined voltage threshold greater than the predetermined maximum error voltage.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1:
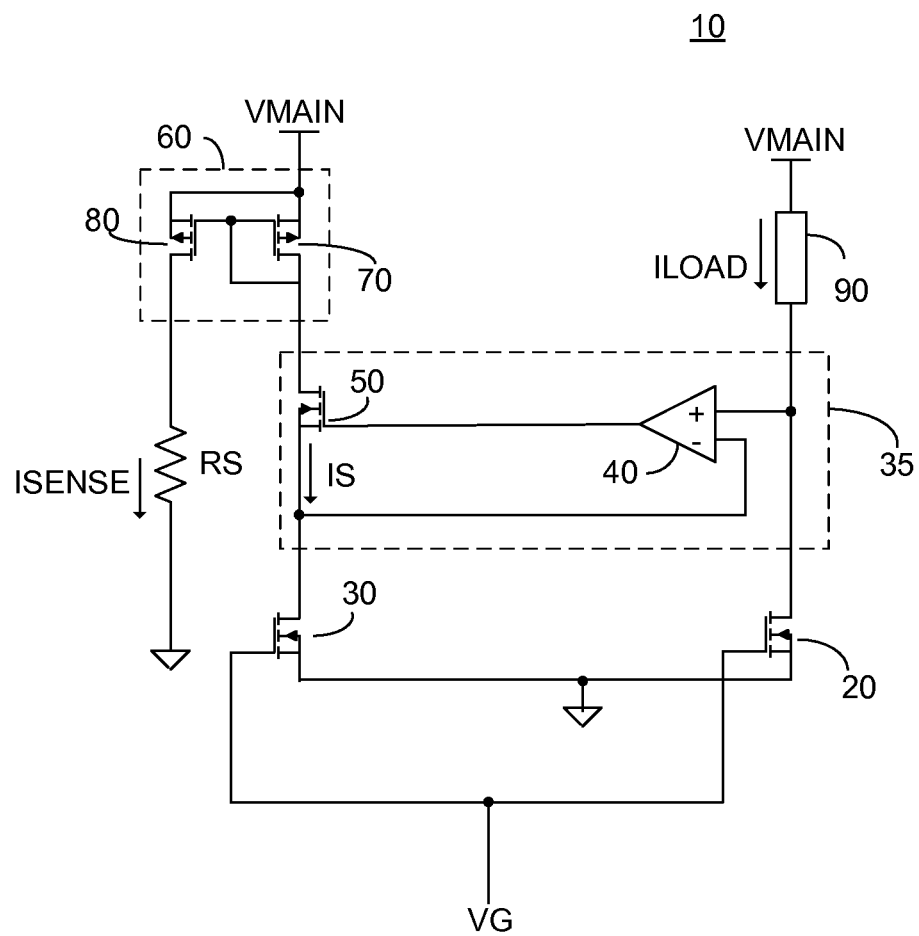
FIG. 1 illustrates a high level schematic diagram of a sense current generation apparatus, according to the prior art.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. The term resistor as used herein refers to an element, preferably defined in an integrated circuit, arranged to present resistance to a current flow there through.

Figure 2:
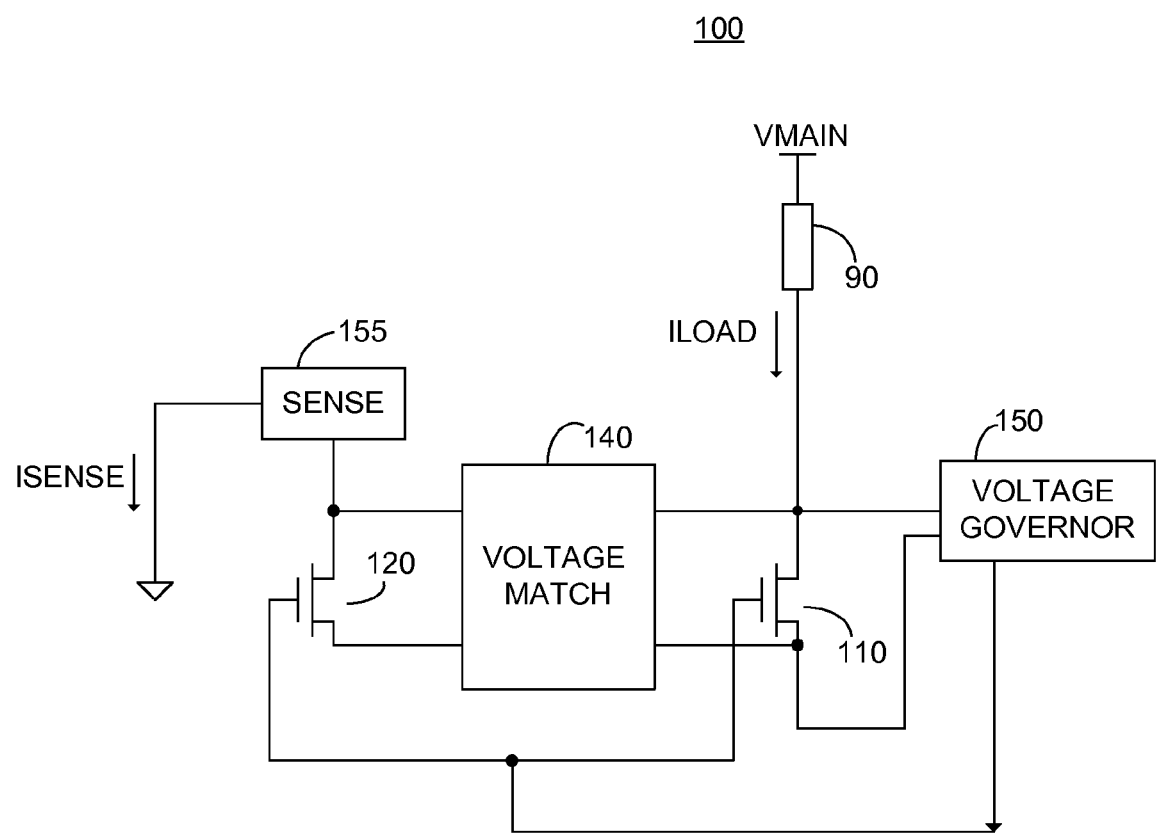
FIG. 2 illustrates a high level schematic diagram of a sense current generation apparatus, comprising a voltage matching circuit and a voltage governor, according to certain embodiments.

FIG. 2 illustrates a high level schematic diagram of a sense current generation apparatus 100, comprising: a main electronically controlled switch 110, hereinafter termed "main switch 110" for brevity; a sense electronically controlled switch 120, hereinafter termed "sense switch 120"; a voltage matching circuit 140; and a voltage governor 150. In one embodiment, each of main switch 110 and sense switch 120 is implemented as a MOSFET, however this is not meant to be limiting in any way. A first terminal of main switch 110 is coupled to a first end of a load 90, a first input of voltage matching circuit 140 and an input of voltage governor 150. A second end of load 90 is coupled to a supply voltage VMAIN and a second terminal of main switch 110 is coupled to a second input of voltage matching circuit 140. The gate of main switch 110 is coupled to the gate of sense switch 120 and to an output of voltage governor 150. A first terminal of sense switch 120 is coupled to a first output of voltage matching circuit 140 and a second terminal of sense switch 120 is coupled to a second output of voltage matching circuit 140. The first terminal of sense switch 120 is further coupled to a sense circuit 155. Voltage matching circuit 140 is shown as coupled between both the sources of main switch 110 and sense switch 120 as well as between the drains of main switch 110 and sense switch 120, however this is not meant to be limiting in any way, and in one embodiment the sources of main switch and 110 and sense switch 120 are directly connected without exceeding the scope.

In operation, a load current ILOAD flows through main switch 110, as described above in relation to main switch 20 of FIG. 1. Voltage matching circuit 140 is arranged to adjust the voltage across the first and second terminals of sense switch 120 to be equal to the voltage across the first and second terminals of main switch 110, within a predetermined error range. In particular, as described above in relation to op-amp 40 of FIG. 1, voltage matching circuit 140 exhibits an offset voltage thereby the terminal voltages of main switch 110 and sense switch 120 are also offset from each other. In one embodiment, the error is not precisely known, however the error is known to within a predetermined error range. As described above in relation to FIG. 1, responsive to the equalization of the terminal voltages of main switch 110 and sense switch 120 a sense current is generated within sense switch 120, the magnitude thereof directly proportional to the magnitude of load current ILOAD and offset by the error of voltage matching circuit 140. The sense current flows through a sense circuit 155 and a current ISENSE is output therefrom. In one non-limiting example, current ISENSE is generated within a current mirror, as described above in relation to FIG. 1.

Voltage governor 150 is arranged to receive an indication of the value of the voltage across the first and second terminals of main switch 110. Responsive to the received voltage value indication, voltage governor 150 is arranged to adjust the gate voltages of main switch 110 and sense switch 120 such that the absolute value of the voltage thereacross is maintained above a predetermined voltage threshold, the predetermined voltage threshold greater than a predetermined maximum boundary of the error voltage. In particular, voltage governor 150 is arranged to control the gate voltage of main switch 110 to adjust the resistance thereof. The current flowing therethrough thus generates an adjusted voltage thereacross. In one embodiment, the predetermined voltage threshold is 10 times greater than the maximum boundary of the error voltage. For example, in the event that the error of voltage matching circuit 140 is up to 30 millivolts, the predetermined voltage threshold is 300 millivolts and voltage governor 150 is arranged to control the gate voltage of main switch 110 and sense switch 120 such that the absolute value of the voltage thereacross the respective first and second terminals is not less than 300 millivolts. Advantageously, the error of voltage matching circuit 140 is then insignificant in relation to the voltage across the first and second terminals of main switch 110 and therefore error E of current ISENSE, described above in relation to EQ. 1, is also insignificant in relation to the magnitude of current ISENSE.

Figure 3:
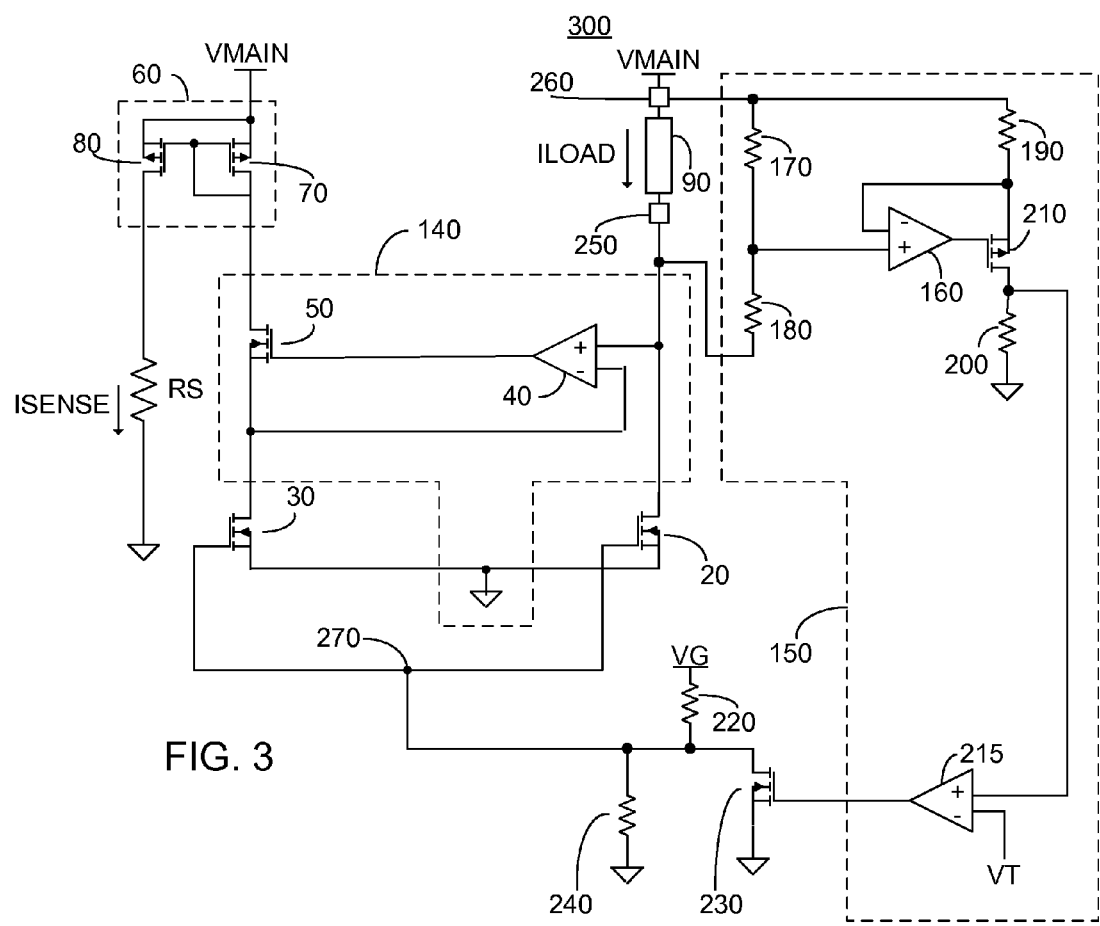
FIG. 3 illustrates a high level schematic diagram of a sense current generation apparatus, showing a detailed embodiment of a voltage matching circuit and a detailed embodiment of a voltage governor, according to certain embodiments.

FIG. 3 illustrates a high level schematic diagram of a sense current generation circuit 300 comprising: a main switch 20; a sense switch 30; a current mirror 60, comprising an input switch 70 and an output switch 80; an impedance element, illustrated as sense resistor RS; a voltage matching circuit 140, comprising an op-amp 40 and a switch 50; a voltage governor 150, comprising a differential amplifier 160, a plurality of resistors 170, 180, 190 and 200, an electronically controlled switch 210 and a differential amplifier 215; a resistor 220; an electronically controlled switch 230, hereinafter termed "switch 230"; and a resistor 240. Each of differential amplifier 160 and differential amplifier 215 is in one embodiment implemented as an op-amp, differential amplifiers 160 and 215 hereinafter termed "op-amp 160" and "op-amp 215", respectively, for brevity. Electronically controlled switch 210 is in one embodiment implemented as a PMOSFET and is hereinafter termed "switch 210", for brevity. Switch 230 is in one embodiment implemented as an NMOSFET.

The source of main switch 20 is coupled to a common potential and the drain of main switch 20 is coupled to the non-inverting input of op-amp 40 and to a first end of resistor 180. The drain of main switch 20 is further coupled to a first end of load 90, via a port 250. A second end of load 90 is coupled to supply voltage VMAIN, via a port 260. The inverting input of op-amp 40 is coupled to the drain of sense switch 30 and the source of switch 50. The output of op-amp 40 is coupled to the gate of switch 50 and the source of sense switch 30 is coupled to the common potential. The gates of both main switch 20 and sense switch 30 are coupled to a node 270. The drain of switch 50 is coupled to the drain of input switch 70 and the gates of input switch 70 and output switch 80. The sources of input switch 70 and output switch 80 are coupled to supply voltage VMAIN. The drain of output switch 80 is coupled to a first end of sense resistor RS and a second end of sense resistor RS is coupled to the common potential.

A second end of resistor 180 is coupled to a first end of resistor 170 and the non-inverting input of op-amp 160. A second end of resistor 170 is coupled to supply voltage VMAIN, via port 260. The inverting input of op-amp 160 is coupled to the source of switch 210 and a first end of resistor 190. A second end of resistor 190 is coupled to supply voltage VMAIN, via port 260, and the output of op-amp 160 is coupled to the gate of switch 210. The drain of switch 210 is coupled to a first end of resistor 200 and the non-inverting input of op-amp 215. A second end of resistor 200 is coupled to the common potential and the inverting input of op-amp 215 is coupled to a voltage threshold, denoted VT. The output of op-amp 215 is coupled to the gate of switch 230 and the source of switch 230 is coupled to the common potential. The drain of switch 230 is coupled to a first end resistor 220, a first end of resistor 240 and node 270. A second end of resistor 220 is coupled to a fixed gate control voltage source VG and a second end of resistor 240 is coupled to the common potential. In one embodiment, load 90 is associated with a powered device (PD) and ports 250 and 260 are ports of a power sourcing equipment (PSE).

In operation, as described above, a current ISENSE is generated responsive to sense switch 30 and current mirror 60, current ISENSE directly proportional to current ILOAD flowing through main switch 20, with an offset of E responsive to the input offset voltage error of op-amp 40. A representation of the drain potential of main switch 20, in reference to the common potential of the source of main switch 20, is received by op-amp 160 and the gate potential of switch 210 is adjusted such that the drain potential of switch 210 is equal to the drain potential representation. In particular, resistors 170 and 180 form a voltage divider of the potential difference between supply voltage VMAIN and the potential of the drain of main switch 20, i.e. the voltage across ports 250 and 260, the divided voltage provided to op-amp 160. The voltage across resistor 190, equal to the divided voltage across ports 250 and 260, is responsive to a current flow therethrough, which flows through resistor 200 and thus provides a representation of the drain potential of main switch 20 to op-amp 215. In the event that the received drain potential representation is lower than voltage threshold VT, i.e. the representation of the voltage across ports 250 and 260 is higher than voltage threshold VT, op-amp 215 is arranged to increase the gate potential of switch 230, thereby increasing the current flow through switch 230, which reduces the potential at node 270, thereby reducing the gate potentials of main switch 20 and sense switch 30. The potential reduction of the gates of main switch 20 and sense switch 30 increase the resistance across each of main switch 20 and sense switch 30 and as a result, current ILOAD will generate an increased voltage across the source and drain of main switch 20, without significantly impacting current ILOAD. As described above, this causes the offset voltage of op-amp 40 to be less significant.

In one embodiment, voltage threshold VT is selected such that the voltage across main switch 20 is ten times greater than the offset voltage of op-amp 40, optionally 300 millivolts.

Advantageously, in the event that current ILOAD increases, the operation of op-amp 215 will cause the resistance of main switch 20 to decrease thereby maintaining the desired voltage thereacross, without any additional intervention. Thus, the operation of voltage governor 150, which is necessary when current ILOAD is very small, does not impede on the regular operation of sense current generation circuit 300 when a large current ILOAD is present.

Sense current generation circuit 300 has been illustrated without a current limit for ILOAD, and thus only control of the drain voltage for main switch 20 is implemented. It is to be understood that in the embodiment of FIG. 3 the voltage at the drain of main switch 20 is compared with VMAIN, however this is not meant to be limiting in any way and the voltage at the drain of main switch 20 may be compared with the common potential without exceeding the scope.

Figure 4:
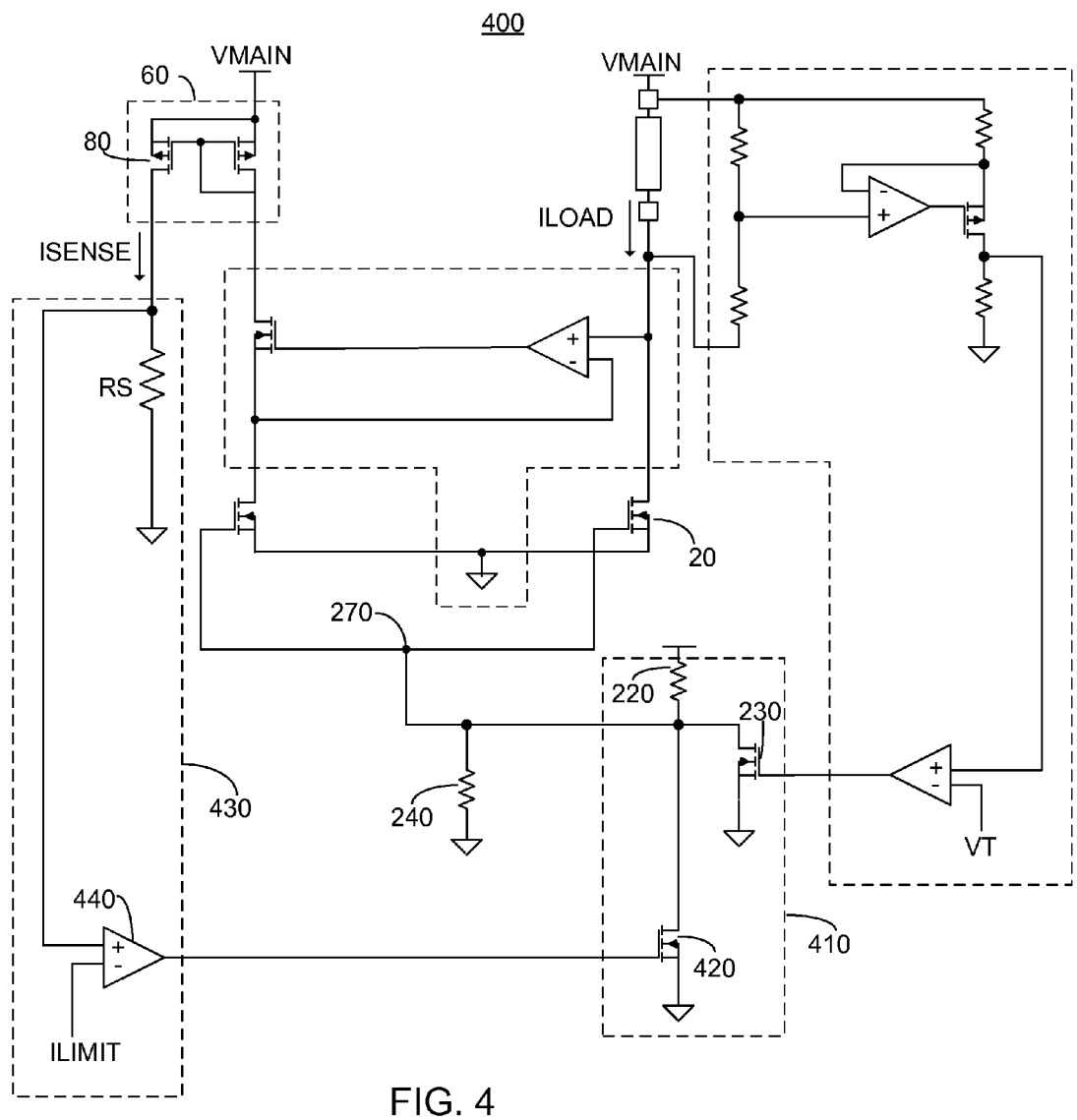
FIG. 4 illustrates a high level schematic diagram of a sense current generation apparatus further comprising a current governor, according to certain embodiments.

FIG. 4 illustrates a high level schematic diagram of a sense current generation apparatus 400. The arrangement of sense current generation apparatus 400 is in all respects similar to sense current generation apparatus 200 of FIG. 3, with the addition of: a combiner 410, comprising resistor 220, switch 230 and an electronically controlled switch 420; and a current governor 430, comprising a differential amplifier 440. Electronically controlled switch 420 is in one embodiment implemented as an NMOSFET and is hereinafter termed "switch 420", for brevity. Differential amplifier 440 is in one embodiment implemented as an op-amp and is herein after termed "op-amp 440", for brevity. The drain of switch 420 is coupled to node 270 and the source of switch 420 is coupled to the common potential. The gate of switch 420 is coupled to the output of op-amp 440 and the inverting input of op-amp 440 is coupled to a current threshold voltage, denoted ILIMIT. The non-inverting input of op-amp 440 is coupled to the first end of sense resistor RS and the drain of output switch 80 of current mirror 60.

The operation of sense current generation apparatus 400 is in all respects similar to the operation of sense current generation apparatus 200, with the addition that the voltage representation of current ISENSE, generated by sense resistor RS, is compared by op-amp 440 to current threshold voltage ILIMIT. In the event that the voltage representation of current ISENSE rises above current threshold voltage ILIMIT, op-amp 440 increases the gate potential of switch 420 thereby reducing the potential at node 270. The reduced potential at node 270 increases the resistance of main switch 20 so as to limit current ILOAD so as not to exceed a desired magnitude, expressed by current threshold voltage ILIMIT. Sense current generation apparatus 400 thus controls the potential at node 270 to: prevent current ILOAD from exceeding the limit set by current threshold voltage ILIMIT; and prevent the voltage at the drain of main switch 20 from falling below a limit set by voltage threshold VT.

Figure 5:
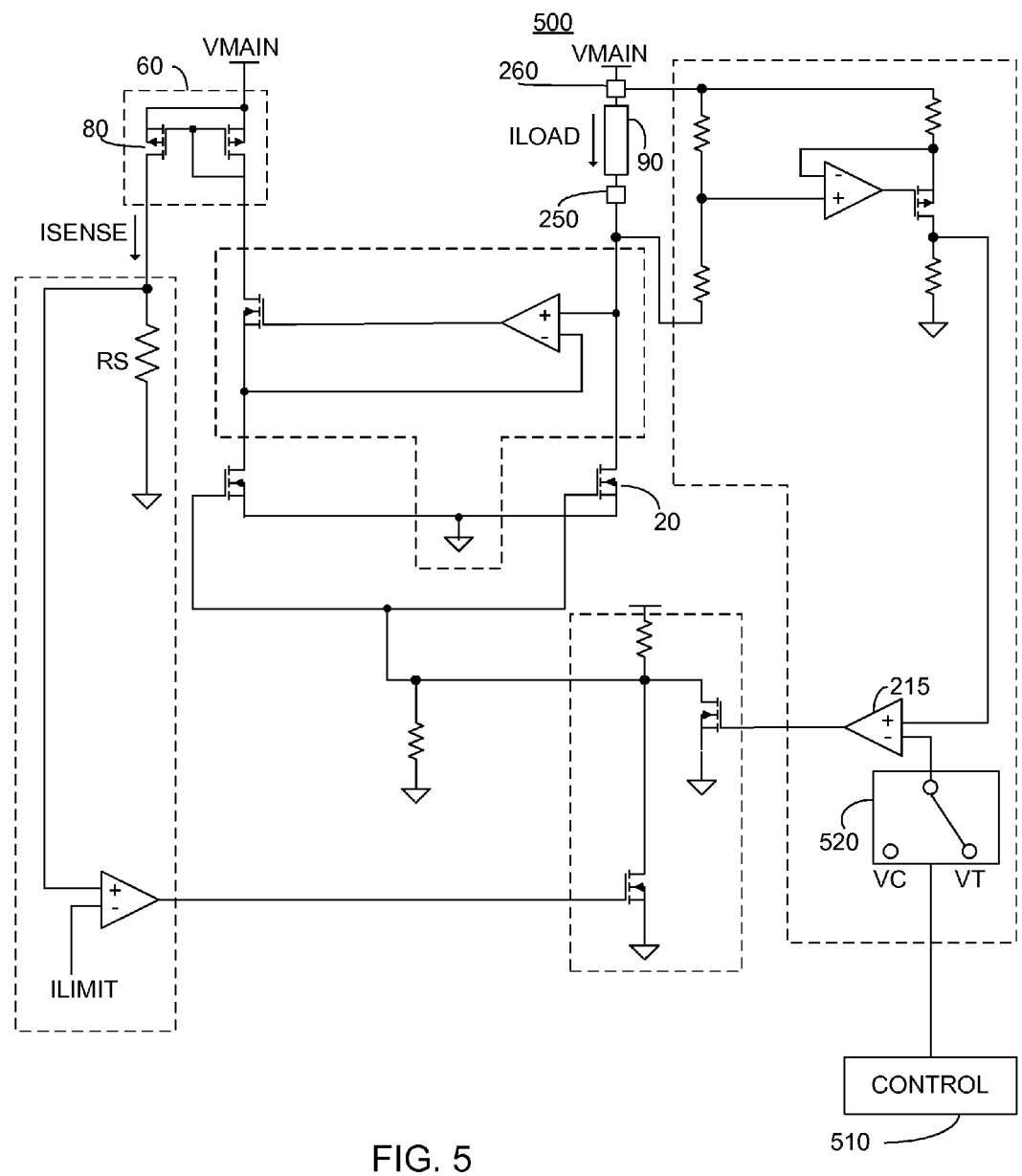
FIG. 5 illustrates a high level schematic diagram of a sense current generation apparatus further comprising an electronically controlled switch arranged to couple an input of a voltage governor alternately to one of two voltage sources, according to certain embodiments.

FIG. 5 illustrates a high level schematic diagram of a sense current generation apparatus 500. The arrangement of sense current generation apparatus 500 is in all respects similar to the arrangement of sense current generation apparatus 400 of FIG. 4, with the addition of a control circuitry 510 and a reference voltage electronically controlled switch 520. In one embodiment, reference voltage electronically controlled switch 520 is implemented as a single pole double throw switch and is hereinafter termed "reference voltage switch 520", for brevity. The inverting input of op-amp 215 is coupled to the pole of reference voltage switch 520, instead of being coupled to voltage threshold VT. A first terminal of reference voltage switch 520 is coupled to voltage threshold VT, and a second terminal of reference voltage switch 520 is coupled to the output of a class reference voltage, denoted VC. An output of control circuitry 510 is coupled to a control port of reference voltage switch 520.

The operation of sense current generation apparatus 500 is in all respects similar to the operation of sense current generation apparatus 400, with the addition that control circuitry 510 is arranged to control reference voltage switch 520 to alternately couple the non-inverting input of op-amp 215 between voltage threshold VT and class reference voltage VC. In further detail, as described above, load 90 is in one embodiment a load of a PD and ports 250 and 260 are ports of a PSE. During classification of a PD, the PSE is arranged to provide a class voltage to the PD. The PD responds with a current, the magnitude thereof indicative of the class type of the PD, as described for example in IEEE standards 802.3af-2002 and 802.3at-2009. Thus, during classification the class verification voltage should be maintained within a predetermined voltage range, termed a "class event voltage" range. Control circuitry 510 is arranged, during classification, to control reference voltage switch 520 such that class reference voltage VC is coupled to the inverting input of op-amp 215. As described above, op-amp 215 causes the voltage across ports 250 and 260 to be maintained at a predetermined value within the class event voltage range, responsive to class reference voltage VC at the inverting input thereof.

After completion of classification of the PD, control circuitry 510 is arranged to control reference voltage switch 520 to couple voltage threshold VT to the inverting input of op-amp 215. The operation of sense current generation apparatus 500 is thereon identical to the operation of sense current generation apparatus 400, described above.

Figure 6A:
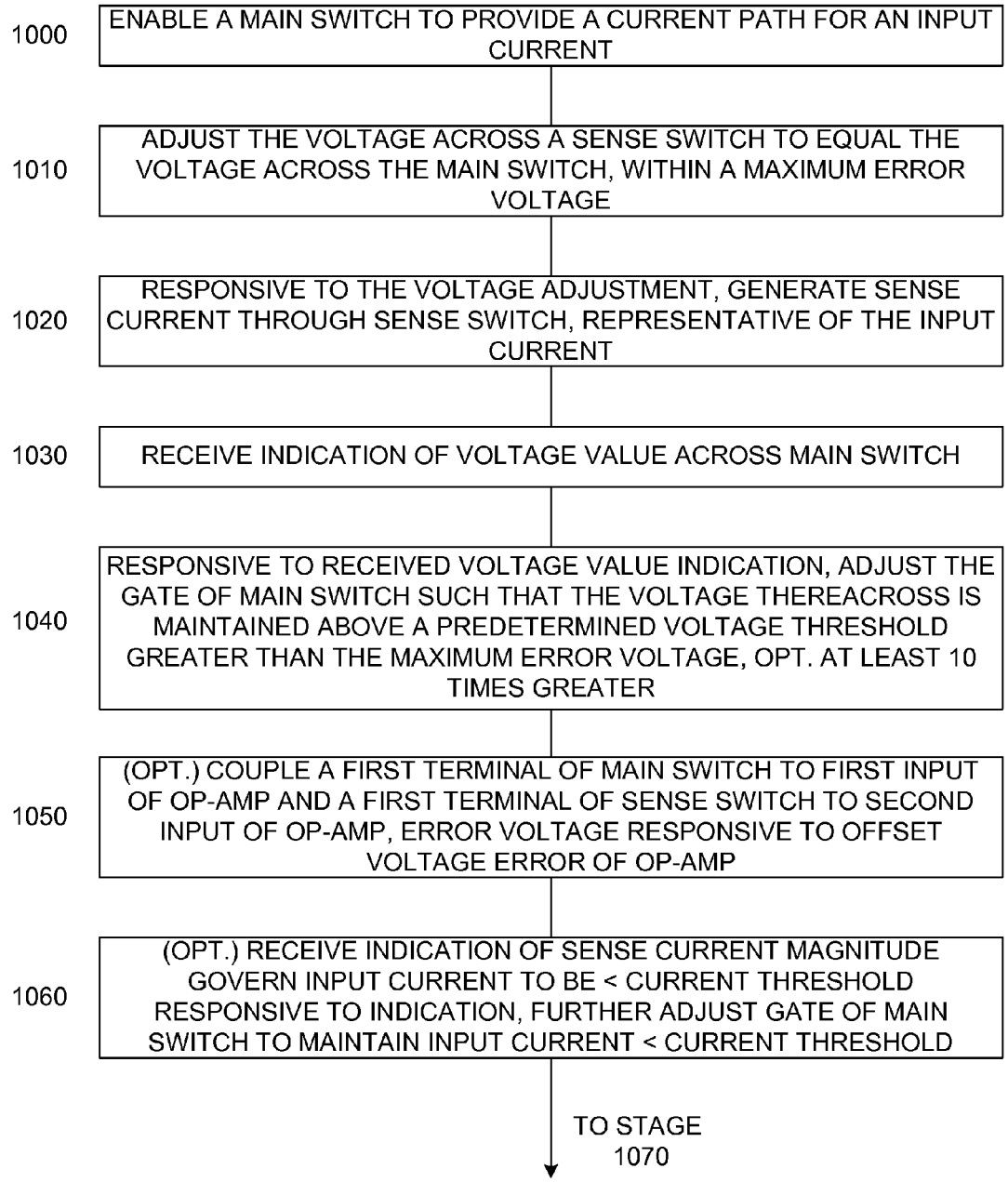
FIGS. 6A-6B illustrate a high level flow chart of a method of sense current generation, according to certain embodiments.
Figure 6B:
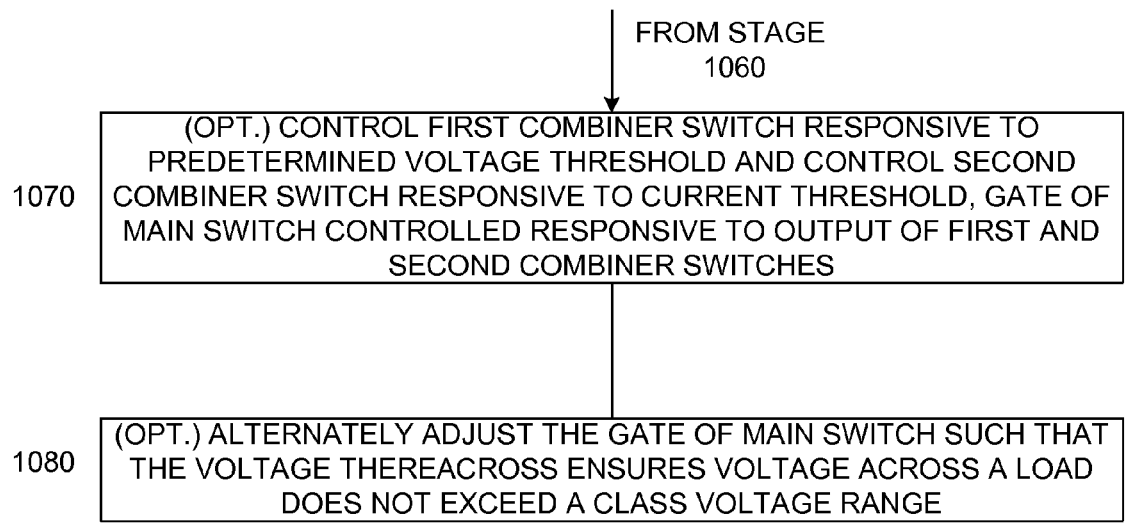

FIGS. 6A-6B illustrate a high level flow chart of a method of generating a sense current, according to certain embodiments. In stage 1000, a main electronically controlled switch is enabled, thereby providing a current path therethrough for an input current. In stage 1010, the voltage across a sense electronically controlled switch is adjusted to equal the voltage across the main electronically controlled switch of stage 1000, with a predetermined maximum error voltage, i.e. there is an error voltage which may be of an unknown quantity, however the maximum amount of the error voltage is known. Optionally, the voltage equalization is performed by a closed loop circuit arranged to equalize the potential of a terminal of the main electronically controlled switch with the equivalent terminal of the sense switch, the error voltage range being an inherent offset voltage error of the closed loop circuit.

In stage 1020, responsive to the voltage adjustment of stage 1010, a sense current is generated through the sense electronically controlled switch, the generated sense current representative of the input current of stage 1000. In stage 1030, an indication of the value of the voltage across the main switch is received. In stage 1040, responsive to the received voltage value indication of stage 1030, the gate voltage of the main electronically controlled switch is adjusted such that the voltage across the terminals of the main electronically controlled switch is maintained above a predetermined voltage threshold. In one embodiment, the gate voltage adjustment is responsive to a voltage governor, such as voltage governor 150 of FIGS. 2, 3. The predetermined voltage threshold is greater than predetermined maximum error voltage of stage 1010, optionally at least 10 times greater than the boundary of the maximum error voltage. For example, if the error range is between −30 mv and +30 mv, the predetermined voltage threshold is at least 300 mv. Optionally, the voltage across the terminals of the main electronically controlled switch is maintained at a predetermined value, the predetermined value being greater than the predetermined threshold.

In optional stage 1050, a first terminal of the main electronically controlled switch of stage 1000 is coupled to a first input of an op-amp and a first terminal of the sense electronically controlled switch of stage 1010 is coupled to a second input of the op-amp, the voltage equalization of stage 1010 responsive to the operation of the op-amp. The maximum error voltage of stage 1010 is thus responsive to the offset voltage error of the op-amp.

In optional stage 1060, an indication of the magnitude of the generated sense current of stage 1020 is received. Responsive to the received sense current magnitude indication, the gate voltage of the main electronically controlled switch is further adjusted such that the input current of stage 1000 is governed to be maintained below a predetermined current threshold. The current governing is preferably responsive to the output of a current governor, such as current governor 430 of FIG. 4. In optional stage 1070, a first electronically controlled switch, such as switch 230 of FIG. 4, is controlled responsive to the voltage threshold of stage 1040 and a second electronically controlled switch, such as switch 420 of FIG. 4, is controlled responsive to the current threshold of stage 1060. The potential of the gate of main electronically controlled switch of stage 1000 is adjusted so as to control both the current flow through the main electronically controlled switch so as not to the current threshold and maintain the voltage potential at the drain of the main electronically controlled switch so as not to be less than the predetermined voltage threshold.

In optional stage 1080, alternately, during a classification stage of operation, adjust the gate voltage of the main switch responsive to a classification voltage such that the voltage across a load coupled to the main switch, such as a PD, is maintained at a predetermined class event voltage.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

The invention claimed is:

1. A sense current generation apparatus comprising:
   a main electronically controlled switch comprising a first terminal, a second terminal, and a gate terminal, said main electronically controlled switch arranged to provide a current path for an input current;
   a sense electronically controlled switch comprising a first terminal and a second terminal, said sense electronically controlled switch arranged to generate a sense current therethrough;
   a voltage matching circuit in communication with said first terminal of said main electronically controlled switch and said first terminal of said sense electronically controlled switch, said voltage matching circuit arranged to adjust a voltage across said first and second terminals of said sense electronically controlled switch to equal a voltage across said first and second terminals of said main electronically controlled switch, within a predetermined maximum error voltage, such that said generated sense current is representative of the input current; and
   a voltage governor arranged to:
      receive an indication of a value of the voltage across said first and second terminals of said main electronically controlled switch; and
      responsive to said received voltage value indication, adjust a voltage on the gate terminal of said main electronically controlled switch such that the absolute value of the voltage across said first and second terminals of said main electronically controlled switch is maintained above a predetermined voltage threshold, said predetermined voltage threshold greater than said predetermined maximum error voltage,
   a current governor arranged to receive an indication of a magnitude of said generated sense current and output a control signal so as to limit the input current so as not to exceed a predetermined current threshold; and
   a combiner in communication with said voltage governor and said current governor,
   said gate terminal voltage of said main electronically controlled switch adjusted responsive to an output of said combiner.

2. The apparatus of claim 1, wherein said predetermined voltage threshold is at least 10 times greater than said predetermined maximum error voltage.

3. The apparatus of claim 1, wherein said voltage matching circuit comprises an amplifier, a first input of said amplifier coupled to said first terminal of said main electronically controlled switch and a second input of said amplifier coupled to said first terminal of said sense electronically controlled switch, said predetermined maximum error voltage range responsive to an offset voltage error of said amplifier.

4. The apparatus of claim 1, wherein said combiner comprises:
   a first combiner electronically controlled switch, a control port of said first combiner electronically controlled switch in communication with an output of said voltage governor, a first terminal of said first combiner electronically controlled switch coupled to the gate terminal of the main electronically controlled switch; and
   a second combiner electronically controlled switch, a control port of said second combiner electronically controlled switch in communication with an output of said current governor, a first terminal of said second combiner electronically controlled switch coupled to the gate terminal of the main electronically controlled switch.

5. A sense current generation apparatus comprising:
   a main electronically controlled switch comprising a first terminal, a second terminal and a gate terminal, said main electronically controlled switch arranged to provide a current path for an input current, wherein said first terminal of said main electronically controlled switch is in communication with a powered device;

a sense electronically controlled switch comprising a first terminal and a second terminal, said sense electronically controlled switch arranged to generate a sense current therethrough;

a voltage matching circuit in communication with said first terminal of said main electronically controlled switch and said first terminal of said sense electronically controlled switch, said voltage matching circuit arranged to adjust a voltage across said first and second terminals of said sense electronically controlled switch to equal a voltage across said first and second terminals of said main electronically controlled switch, within a predetermined maximum error voltage, such that said generated sense current is representative of the input current;

a voltage governor arranged to:
  receive an indication of a value of the voltage across said first and second terminals of said main electronically controlled switch; and
  responsive to said received voltage value indication, adjust a voltage on said gate terminal of said main electronically controlled switch such that the absolute value of the voltage across said first and second terminals of said main electronically controlled switch is maintained above a predetermined voltage threshold, said predetermined voltage threshold greater than said predetermined maximum error voltage, a control circuitry; and a reference voltage electronically controlled switch responsive to said control circuitry, said reference voltage electronically controlled switch arranged to alternately couple an input of said voltage governor between a minimum reference voltage and a class reference voltage, wherein said predetermined voltage threshold is responsive to the minimum reference voltage, and wherein the voltage output of said class reference voltage is responsive to a class event voltage range.

6. A method of generating a sense current, the method comprising:

enabling a main electronically controlled switch to provide a current path for an input current, the main electronically controlled switch comprising a first terminal, a second terminal and a gate terminal;

adjusting a voltage across a first and second terminal of a sense electronically controlled switch to equal a voltage across the first and second terminals of the main electronically controlled switch, within a predetermined maximum error voltage;

responsive to said sense electronically controlled switch voltage adjustment, generating a sense current through the sense electronically controlled switch, said generated sense current representative of the input current;

receiving an indication of a value of the voltage across the first and second terminals of the main electronically controlled switch;

responsive to said received voltage value indication, adjusting a voltage at the gate terminal of said main electronically controlled switch such that the voltage between the first terminal and the second terminal of said main electronically controlled switch is maintained above a predetermined voltage threshold, said predetermined voltage threshold greater than said predetermined maximum error voltage;

receiving an indication of a magnitude of said generated sense current; and responsive to said received current magnitude indication, further adjusting the voltage at the gate terminal of said main electronically controlled switch so as to maintain the input current below a predetermined current threshold.

7. The method of claim 6, wherein said predetermined voltage threshold is at least 10 times greater than the predetermined maximum error voltage.

8. The method of claim 6, further comprising:
coupling the first terminal of the main electronically controlled switch to a first input of an amplifier; and
coupling the first terminal of the sense electronically controlled switch to a second input of the amplifier,
wherein said predetermined maximum error voltage is responsive to an offset voltage error of the amplifier.

9. The method of claim 6, wherein said further adjusting comprises:
controlling a first combiner electronically controlled switch whose output is coupled to the gate terminal of the main electronically controlled switch so that the voltage between the first terminal and the second terminal of said main electronically controlled switch is maintained above said predetermined voltage threshold; and
controlling a second combiner electronically controlled switch so as to maintain the input current below said predetermined current threshold.

10. A method of generating a sense current, the method comprising:

enabling a main electronically controlled switch to provide a current path for an input current, the main electronically controlled switch comprising a first terminal, a second terminal and a gate terminal;

adjusting a voltage across a first and second terminal of a sense electronically controlled switch to equal a voltage across the first and second terminals of the main electronically controlled switch, within a predetermined maximum error voltage;

responsive to said sense electronically controlled switch voltage adjustment, generating a sense current through the sense electronically controlled switch, said generated sense current representative of the input current;

receiving an indication of a value of the voltage across the first and second terminals of the main electronically controlled switch;

responsive to said received voltage value indication, adjusting a voltage on the gate terminal of said main electronically controlled switch such that the voltage across the first and second terminals of said main electronically controlled switch is maintained above a predetermined voltage threshold, said predetermined voltage threshold greater than said predetermined maximum error voltage; and alternately adjusting the gate voltage of said main electronically controlled switch such that the voltage across a load coupled to the first terminal of said main electronically controlled switch is maintained at a class event voltage.

* * * * *